United States Patent
Ye et al.

(10) Patent No.: US 7,960,283 B2
(45) Date of Patent: *Jun. 14, 2011

(54) METHOD FOR REDUCING SILICIDE DEFECTS IN INTEGRATED CIRCUITS

(75) Inventors: Jeff Jianhui Ye, Bristow, VA (US); Huang Liu, Singapore (SG); Alex K H See, Singapore (SG); Wei Lu, Singapore (SG); Hai Cong, Singapore (SG); Hui Peng Koh, Singapore (SG); Mei Sheng Zhou, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/825,325

(22) Filed: Jun. 28, 2010

(65) Prior Publication Data

US 2010/0267236 A1    Oct. 21, 2010

Related U.S. Application Data

(63) Continuation of application No. 12/124,177, filed on May 21, 2008, now Pat. No. 7,745,320.

(51) Int. Cl.
*H01L 21/28* (2006.01)
*H01L 21/311* (2006.01)

(52) U.S. Cl. ........ 438/682; 438/595; 438/664; 438/655; 438/656; 257/E21.158; 257/E21.199; 257/384; 257/E29.161; 257/E29.139

(58) Field of Classification Search .......... 257/382–384, 257/214, 754, 755, 757, 407, 412, E29.139, 257/E29.161, E21.199, E21.158; 438/184, 438/231, 302, 303, 581, 586, 592, 595, 661, 663–665, 655, 656, 659, 682

See application file for complete search history.

(56) References Cited

U.S. PATENT DOCUMENTS

| | | | |
|---|---|---|---|
| 6,072,222 A | 6/2000 | Nistler | |
| 6,528,376 B1 | 3/2003 | Guo | |
| 6,656,808 B2 | 12/2003 | Kwean | |
| 6,673,683 B1 | 1/2004 | Sheu et al. | |
| 7,091,106 B2 | 8/2006 | Bonser et al. | |
| 7,091,128 B2 | 8/2006 | Ajmera et al. | |
| 7,208,398 B2 | 4/2007 | Chen et al. | |
| 7,745,320 B2* | 6/2010 | Ye et al. | 438/595 |
| 2005/0242376 A1 | 11/2005 | Chen et al. | |
| 2006/0267117 A1 | 11/2006 | Jaiswal | |
| 2007/0059911 A1 | 3/2007 | Jawarani et al. | |
| 2007/0077760 A1 | 4/2007 | Wong et al. | |
| 2008/0237743 A1 | 10/2008 | Ramin et al. | |

OTHER PUBLICATIONS

C. H. Yu et al., Ultrafast directional nickel-silicide-induced crystallization of amorphous silicon under high-density current stressing, Applied Physics Letters, Mar. 24, 2003, pp. 1857-1859, vol. 2, No. 12.

* cited by examiner

*Primary Examiner* — Victor Mandala
*Assistant Examiner* — Whitney Moore
(74) *Attorney, Agent, or Firm* — Horizon IP Pte Ltd

(57) ABSTRACT

A method for forming silicide contacts in integrated circuits (ICs) is described. A spacer pull-back etch is performed during the salicidation process to reduce the stress between the spacer and source/drain silicide contact at the spacer undercut. This prevents the propagation of surface defects into the substrate, thereby minimizing the occurrence of silicide pipe defects. The spacer pull-back etch can be performed after a first annealing step to form the silicide contacts.

20 Claims, 11 Drawing Sheets

METHOD FOR REDUCING SILICIDE DEFECTS IN INTEGRATED CIRCUITS

CROSS-REFERENCE TO RELATED APPLICATION

This application is a continuation application which claims benefit of copending U.S. patent application Ser. No. 12/124,177, filed on May 21, 2008. All disclosures are incorporated herewith by reference.

FIELD OF THE INVENTION

The present invention relates generally to integrated circuits (ICs), and more particularly to a method for reducing silicide defects in an IC.

BACKGROUND OF THE INVENTION

Transistors are commonly used in integrated circuits. FIG. 1a shows a conventional n-type metal oxide semiconductor (MOS) transistor 110 formed on an active region of a substrate 105. A p-well 108 is located in active region of the substrate. Shallow trench isolations 180 are used to isolate the active region from other device regions. The transistor has source/drain diffusion regions 125a-b adjacent to a gate 130, which includes a gate electrode 131 over a gate dielectric layer 132. Located on the gate sidewalls are dielectric sidewall spacers 160. Metal silicide contacts 140 and 141 are provided on the surface of the substrate in the source/drain regions and gate electrode.

Nickel silicide or nickel alloy silicides have been extensively used in contacts due to low sheet resistance properties. Nickel (Ni) atoms, however, are highly diffusive. During processing, Ni atoms can diffuse beneath the spacers, resulting in the formation of Ni pipes 148. Ni pipes can lead to junction leakage, negatively affecting device performance or functionality. FIG. 1b shows a TEM image of nickel pipes 148. As shown, such nickel pipes can result in gate-to-source or gate-to-drain short circuits.

In view of the foregoing, it is desirable to provide transistors with metal silicide contacts which reduce or minimize the formation of metal pipes.

SUMMARY OF THE INVENTION

The present invention relates to reducing silicide defects in ICs. In one aspect of the invention, an IC having a transistor that comprises a gate on a substrate is provided. The gate has gate sidewalls. The transistor further comprises dielectric spacers disposed on the gate sidewalls and metal silicide contacts over the diffusion regions. The outer walls of the dielectric spacers are aligned with the metal silicide contacts to reduce stress on the contacts.

In another aspect of the invention, a method for forming a transistor in an IC comprises the steps of providing a substrate having a gate on the substrate, the gate having gate sidewalls, and diffusion regions in the substrate adjacent to the gate. Dielectric spacers are formed on the gate sidewalls. Metal silicide contacts are formed over the diffusion regions. The outer walls of the dielectric spacers are aligned with the metal silicide contacts to reduce stress on the contacts.

In another aspect of the invention, a method for reducing formation of metal pipes is disclosed. The method includes providing a feature on a substrate and forming dielectric spacers on sidewalls of the feature. Metal silicide contacts are formed on the substrate adjacent to the dielectric spacers, wherein outer walls of the dielectric spacers are aligned with edges of the metal silicide contacts. By aligning the outer walls of the dielectric spacers with edges of metal silicide contacts, formation of metal pipes is reduced.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DESCRIPTION OF THE INVENTION

The present invention relates to ICs. More particularly, the present invention relates to a method for forming silicide contacts in ICs. In accordance with the invention, a spacer pull-back etch is performed during the silicidation process to form silicide contacts to eliminate or reduce substrate stress that may contribute to the formation of pipe defects.

Figure 1A:
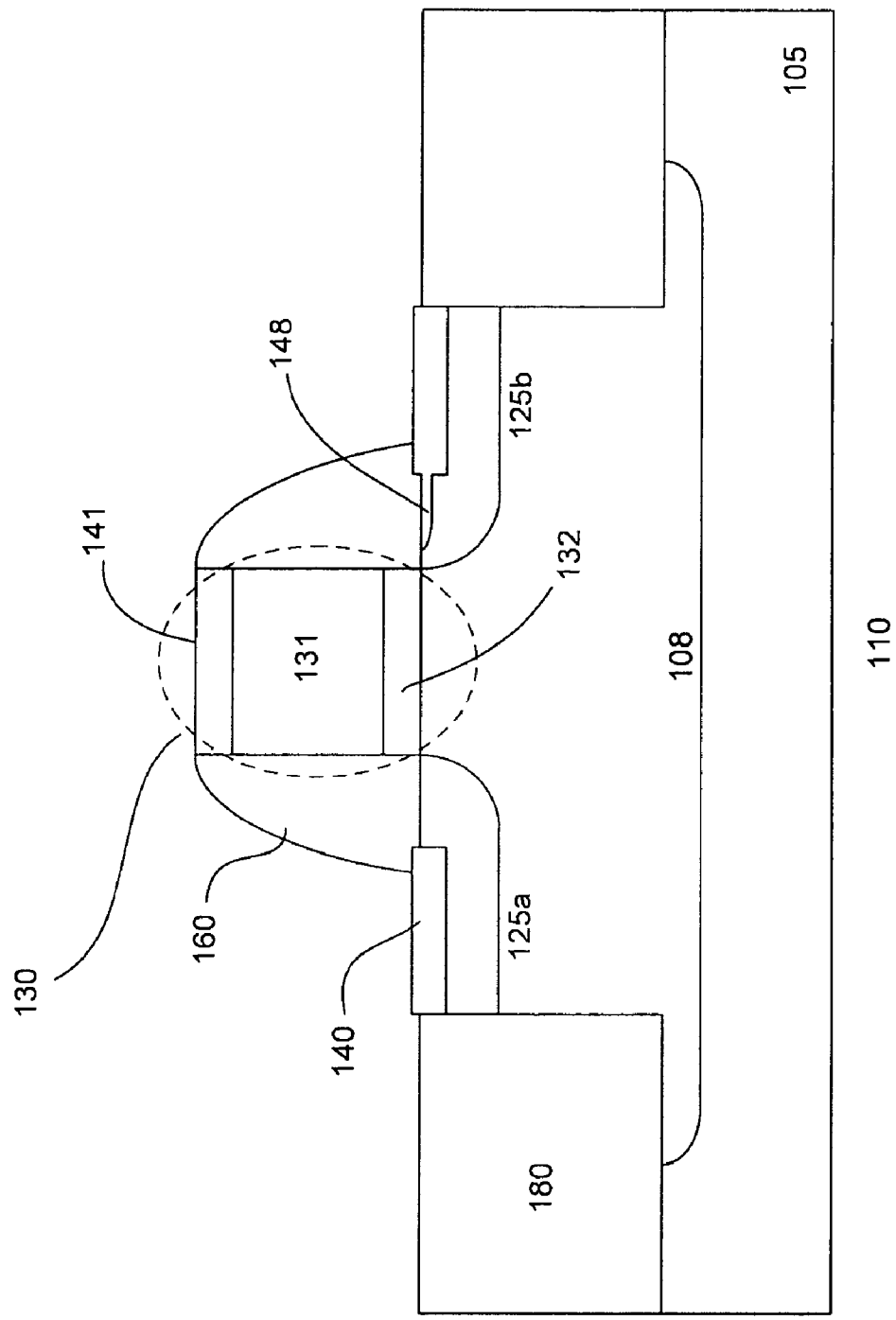
FIGS. 1a-b show a conventional transistor with metal pipes.
Figure 1B:
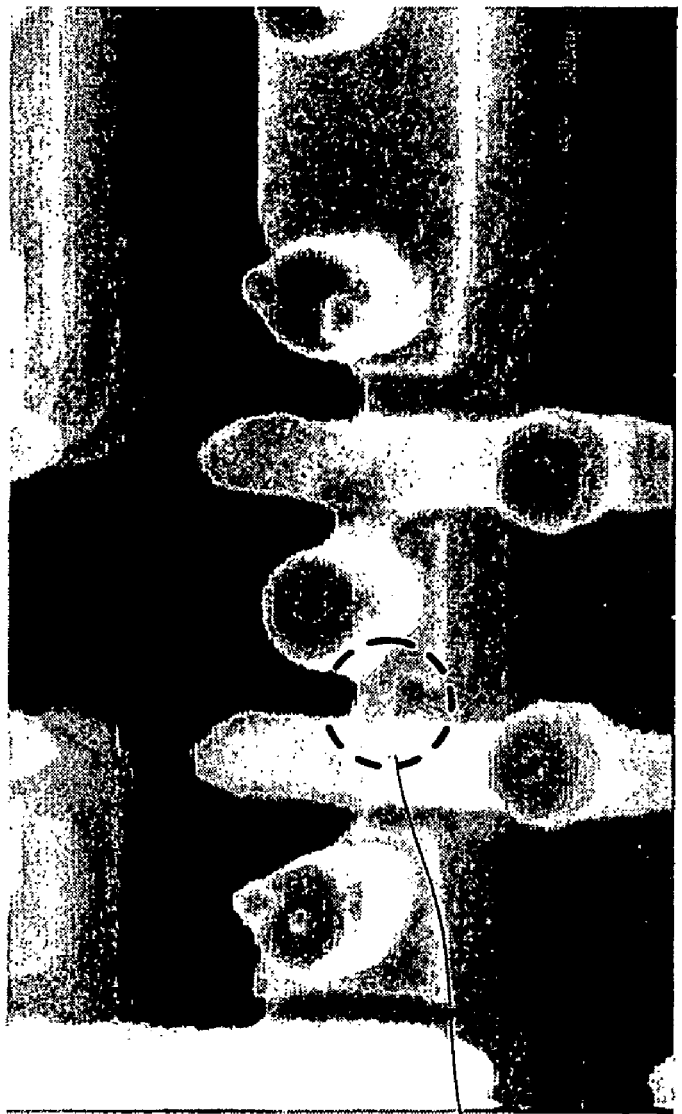
Figure 2:
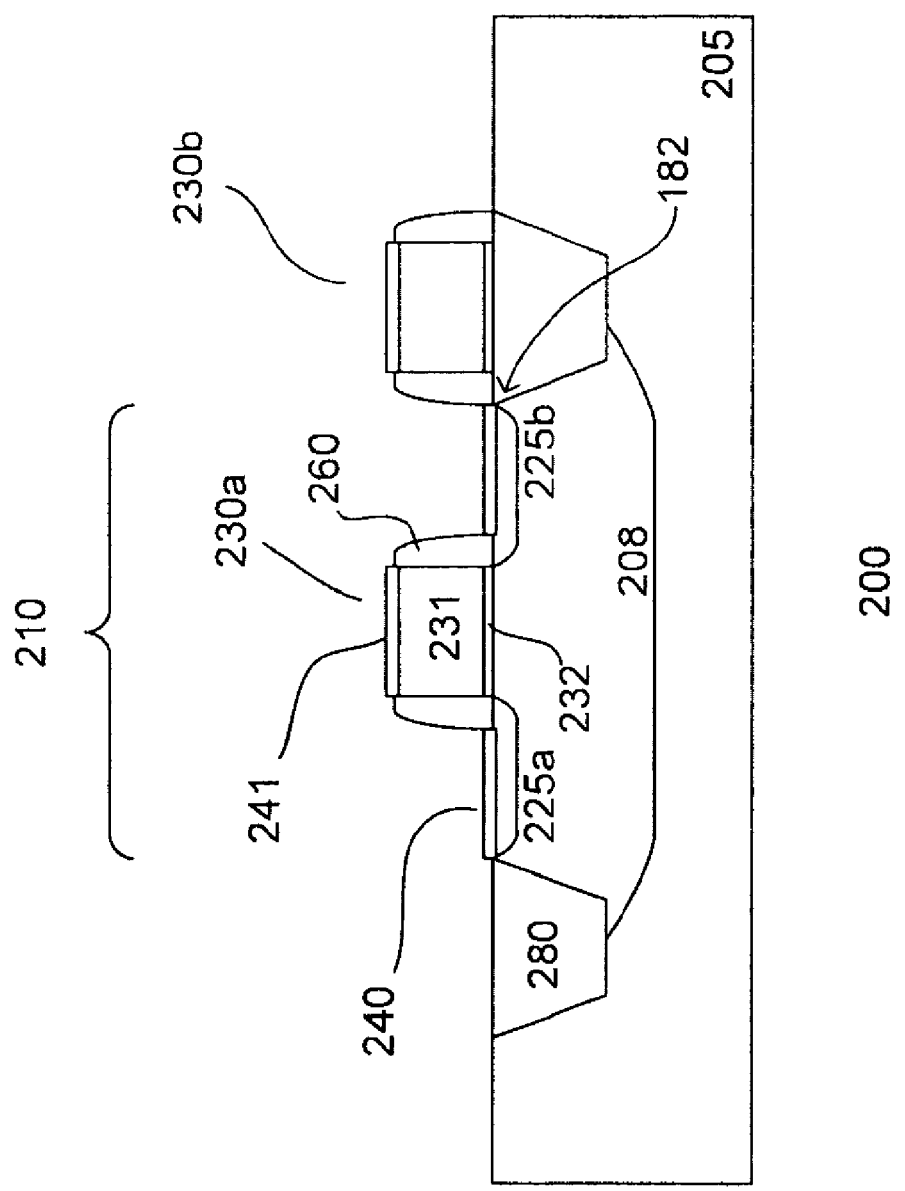
FIG. 2 shows a transistor in accordance with one embodiment of the invention.

FIG. 2 shows a portion of an IC 200 in accordance with one embodiment of the invention. The portion includes a transistor 210 formed in an active region 208 in the substrate 205. The active region is isolated from other device regions by, for example, shallow trench isolations (STIs) 280. In one embodiment, the substrate comprises a silicon substrate, such as a lightly doped p-type substrate. Other types of substrates, such as silicon on insulator (SOI) or silicon germanium, are also useful. The depth of the STIs should be sufficient to reduce or minimize leakage or punch-through. Typically, the depth of the STIs is about 2000-6000 Å. The substrate comprises a well heavily doped with dopants of a second polarity type. The second polarity type comprises, for example, p-type. Doping the well with n-type dopants is also useful. The depth of the well is typically about 1-12 µm below the STIs.

The transistor comprises a gate 230a on the substrate. The gate includes a gate electrode 231 over a gate dielectric 232. Typically, the gate electrode is formed from polysilicon and the gate dielectric is formed from thermal oxide. Other types of materials are also useful. Source/drain diffusion regions 225a-b are located adjacent to the gate beneath the substrate surface. The source/drain diffusion regions are heavily doped with dopants of a first polarity type. The first polarity type, for example, comprises n-type, forming a n-type transistor. Forming p-type transistors with p-type dopants as the first polarity type is also useful. As shown, a gate 230b is also provided over one of the STIs. Typically, a gate comprises a gate conductor that extends into various active and inactive regions (e.g., STIs) of the substrate. Other circuit arrangements are also useful. Dielectric spacers 260 are disposed on the gate sidewalls. The dielectric spacers, for example, are formed from silicon nitride. Other types of dielectric materials are also useful. Contacts 240 and 241 are provided over the diffusion regions and gate electrodes. In one embodiment, the contacts comprise metal silicide. The metal silicide, for example, comprises nickel, platinum, gold, or a nickel alloy, such as nickel-platinum. Other metal silicides are also useful.

In accordance with one embodiment of the invention, the outer surface of the dielectric spacers is in alignment with the metal silicide contacts. Aligning the outer surfaces of the dielectric spacers with the silicide contacts avoids the formation of spacer material over the silicide contacts. This has been found to reduce stress on the metal silicide contacts during processing. Additionally, aligning the spacers with the contacts has also been found to reduce stress in the divot area 182 at the corner of the STI during processing. Reducing stress on the divot areas of the STI and on the metal silicide contacts reduces or prevents the formation of metal pipes.

Figure 3A:
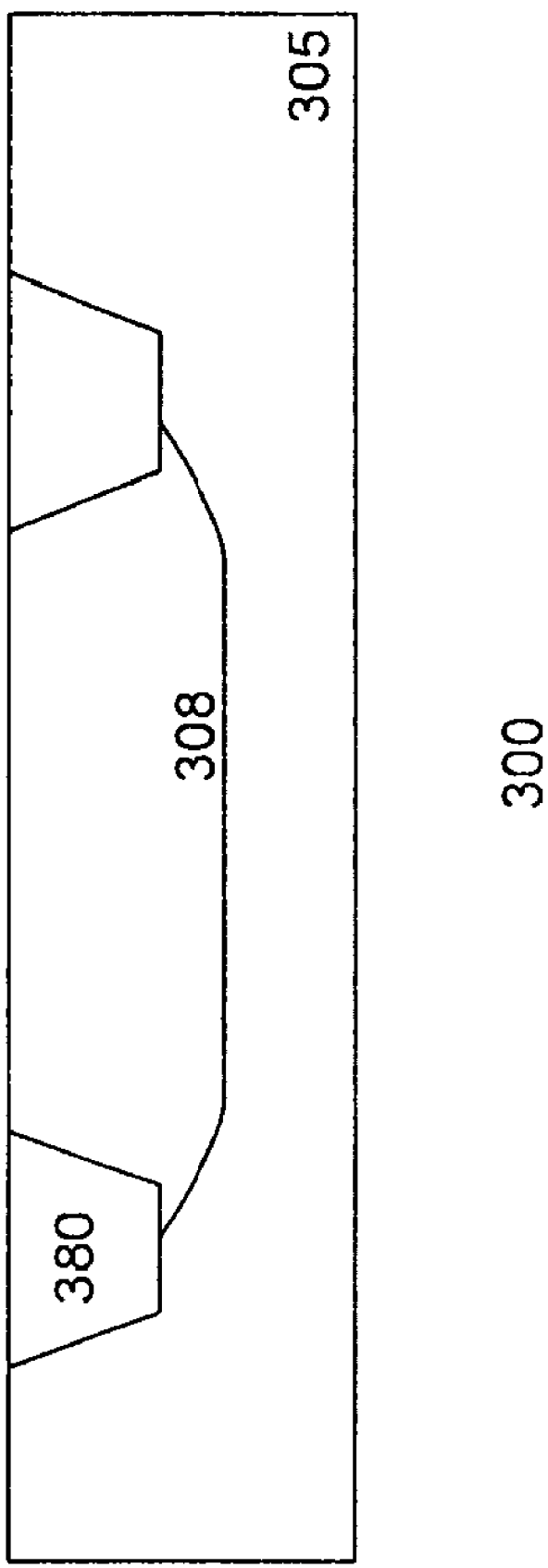
FIGS. 3a-h show a process for forming a transistor in accordance with one embodiment of the invention.

FIGS. 3a-h show a process for forming an IC 300 in accordance with one embodiment of the invention. Referring to FIG. 3a, a semiconductor substrate 305 is provided. The substrate, in one embodiment, comprises a p-type silicon substrate. Other types of substrates, such as a germanium-based, gallium arsenide, silicon-on-insulator (SOI), or sapphire substrate, are also useful. The substrate is prepared with an active region 308. The active region comprises a well heavily doped with dopants of a second polarity type. To form the active region, conventional ion implantation techniques, such as implantation with a mask can be used. Other techniques for forming the active region are also useful.

Isolating the active regions from other device regions on the substrate are isolation regions 380. The isolation regions, for example, comprise STI regions. The depth of the STIs should be sufficient to prevent leakage or punch through. Typically, the depth of the STIs is about 2000-6000 Å. Various conventional processes can be employed to form the STI regions. For example, the substrate can be etched using conventional etch and mask techniques to form trenches which are then filled with dielectric material such as silicon oxide. Chemical mechanical polishing (CMP) can be performed to remove excess oxide and provide a planar substrate top surface. The STI regions can be formed, for example, prior to or after the formation of the doped wells.

Figure 3B:
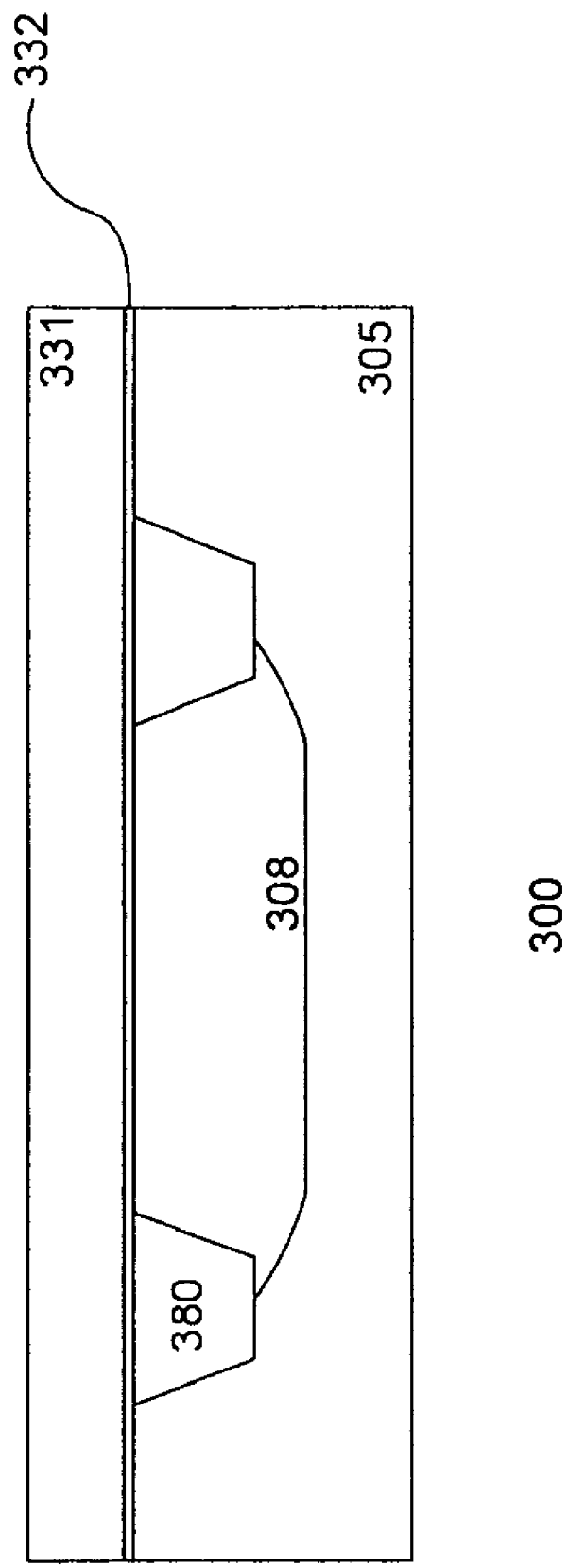

Referring to FIG. 3b, the process continues to form the gate layers on the substrate. For example, forming the gate layers comprises sequentially forming a gate dielectric layer 332 and a gate electrode layer 331 on the substrate surface. In one embodiment, the gate dielectric layer comprises thermal oxide. Other types of gate dielectrics are also useful. The gate electrode layer, for example, comprises polysilicon. Other types of gate electrode materials, for example, metals such as Al, are also useful. The gate layer, in one embodiment, can comprise a heavily doped polysilicon layer of a first polarity type. The polysilicon can be in-situ doped or doped by ion implantation after deposition. Providing undoped polysilicon is also useful.

Figure 3C:
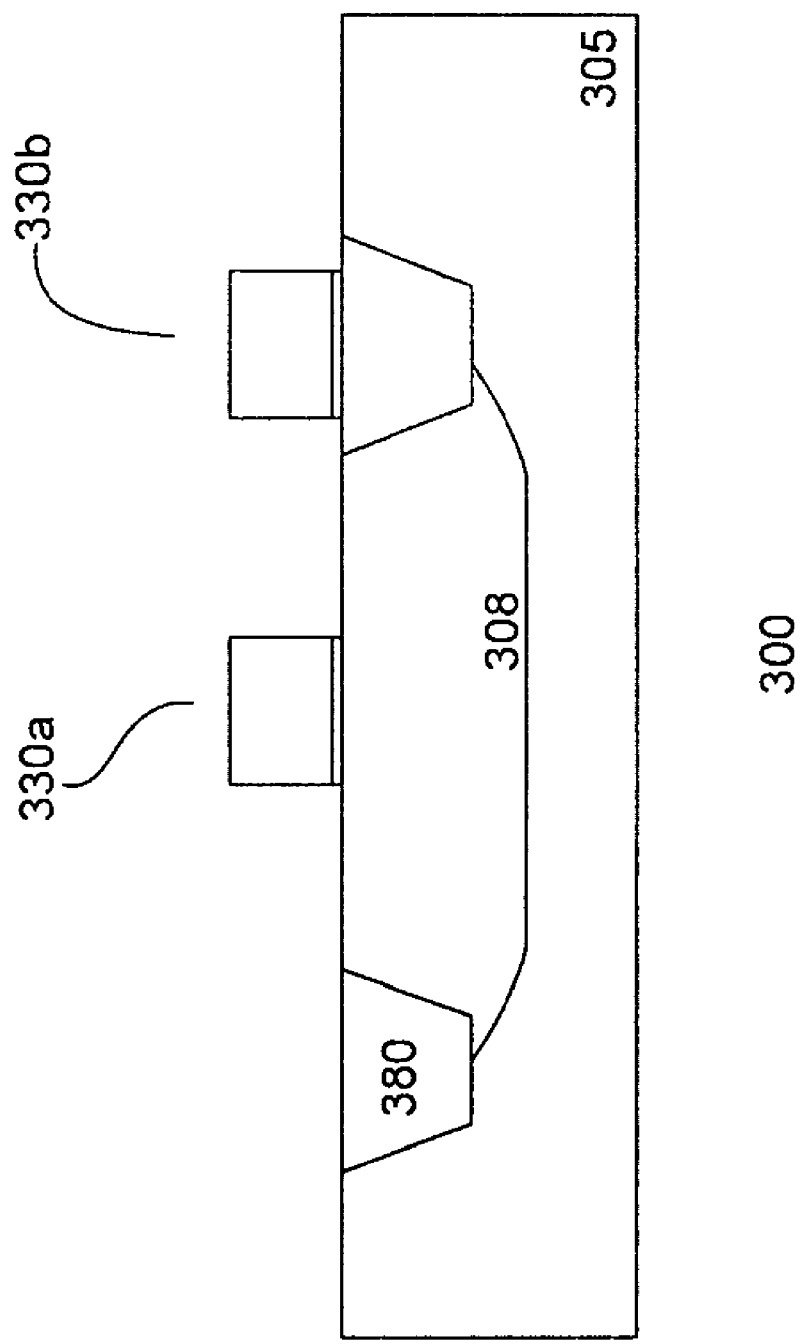
Figure 3D:
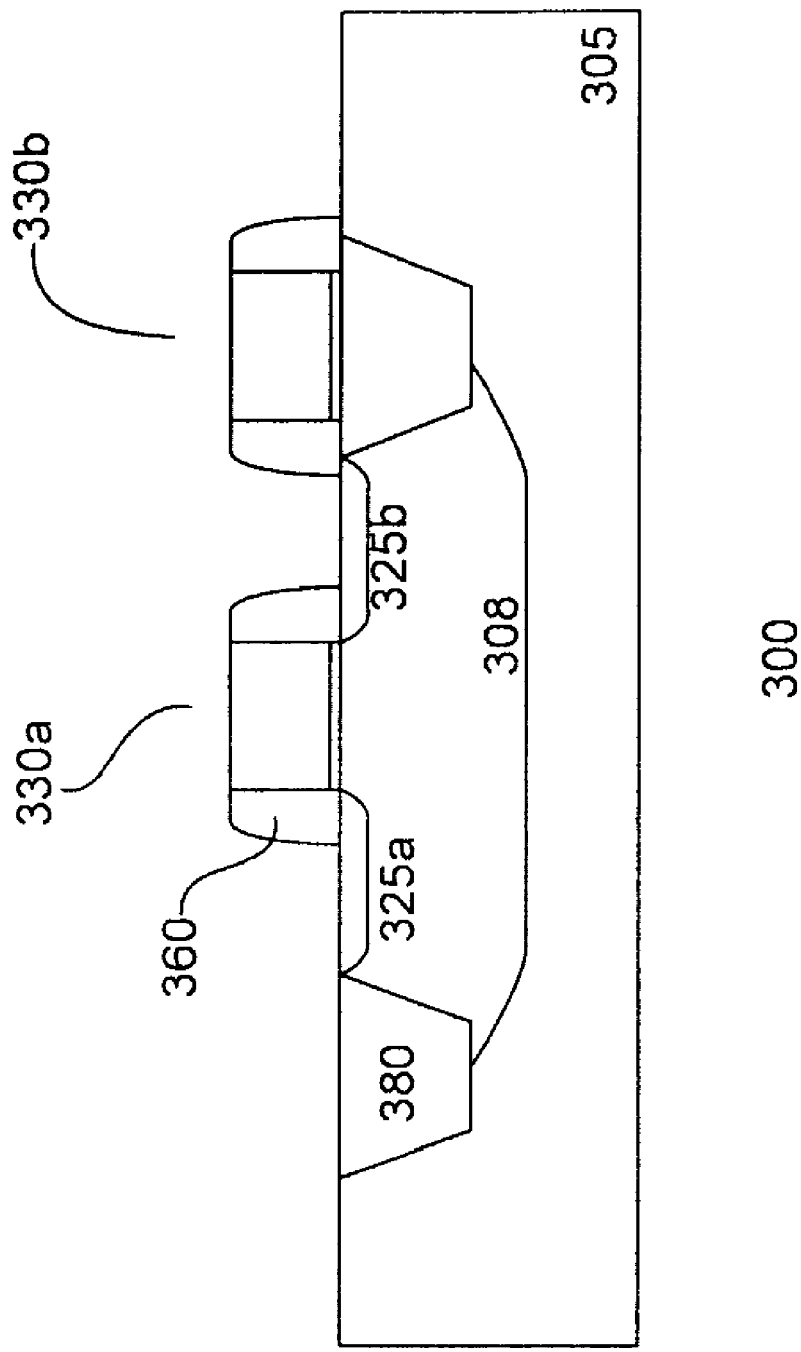

Referring to FIG. 3c, the layers are then patterned using conventional mask and etch techniques to form gates 330a-b. As shown, gate 330a is formed in the active region while gate 330b is formed over a STI. Source/drain diffusion regions 325a-b are formed in the active region of the substrate adjacent to the gate 330a, as shown in FIG. 3d. The diffusion regions, for example, comprise heavily doped regions of the first polarity type. The doped regions can be formed by ion implantation.

Spacers 360, as shown in FIG. 3d, are formed on sidewalls of the gates. The spacers comprise, for example, a dielectric material. In one embodiment, the spacers comprise silicon nitride (SiN). Other dielectric materials including, for example, silicon dioxide, oxide-nitride-oxide (ONO) stacks, TEOS or silicon oxy-nitride ($SiO_xN_y$) are also useful. Conventional processes may be employed to form the spacers. For example, the dielectric layer can be blanket deposited over the substrate, covering the transistors and the substrate. The layer can be deposited by, for example, chemical vapor deposition (CVD). A spacer etch is then performed to form the spacers. The spacers can be formed using an anisotropic etch, such as reactive ion etch (RIE) or dry etch.

In one embodiment, the diffusion regions comprise lightly and heavily doped regions. Typically, the light doped regions are formed by a first ion implantation process before spacer formation. After spacer formation, a heavily doped region is formed by a second ion implantation process. Other types of techniques for forming the diffusion regions are also useful.

Figure 3E:
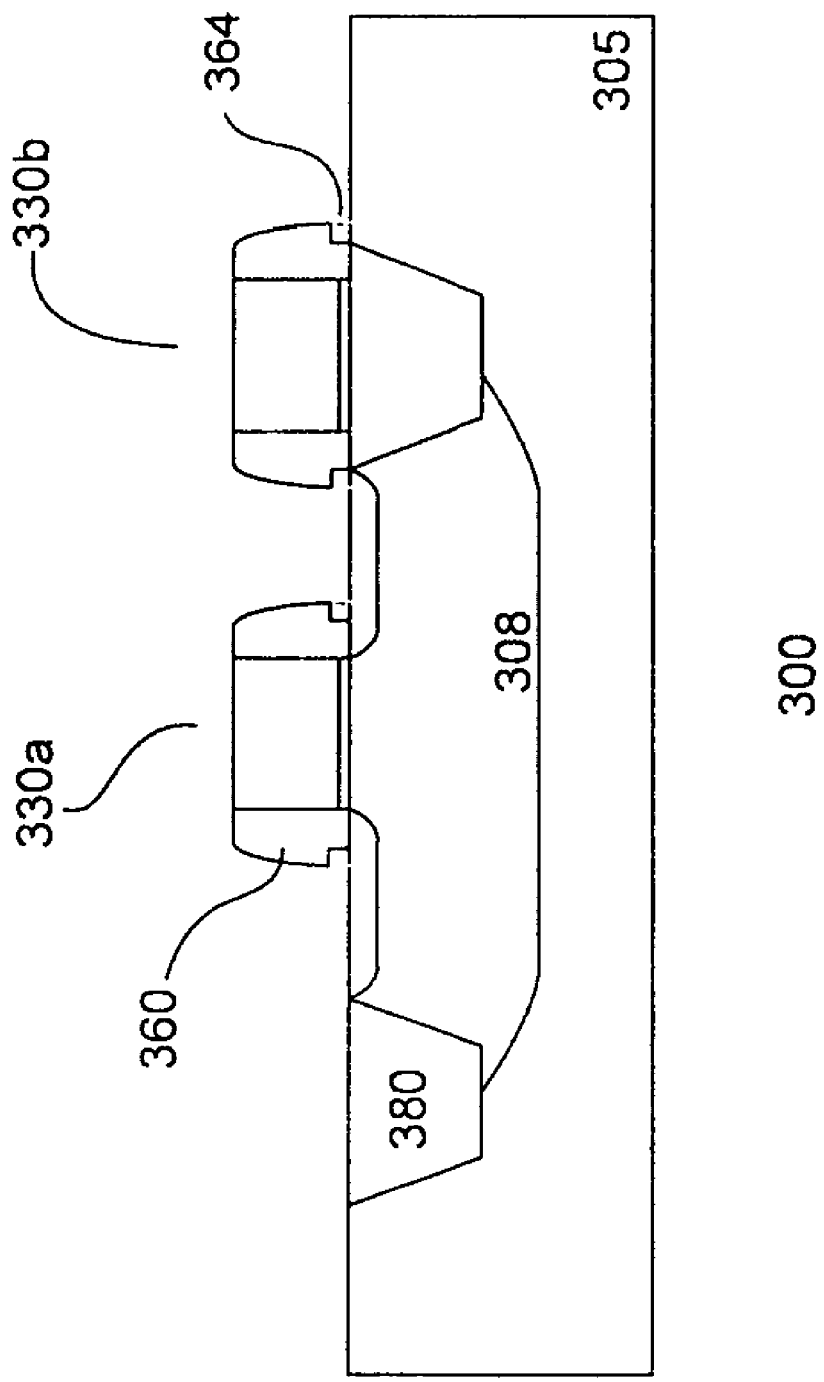

Referring to FIG. 3e, a pre-silicide clean is performed. The pre-silicide clean, for example, comprises wet cleaning using DHF in a dilute aqueous solution. Other clean chemistries or processes are also useful. The pre-silicide clean prepares the substrate for metal deposition by removing native oxide on the gate and source/drain diffusion regions. The clean process forms undercuts 364 in the bottom of the spacers.

Figure 3F:
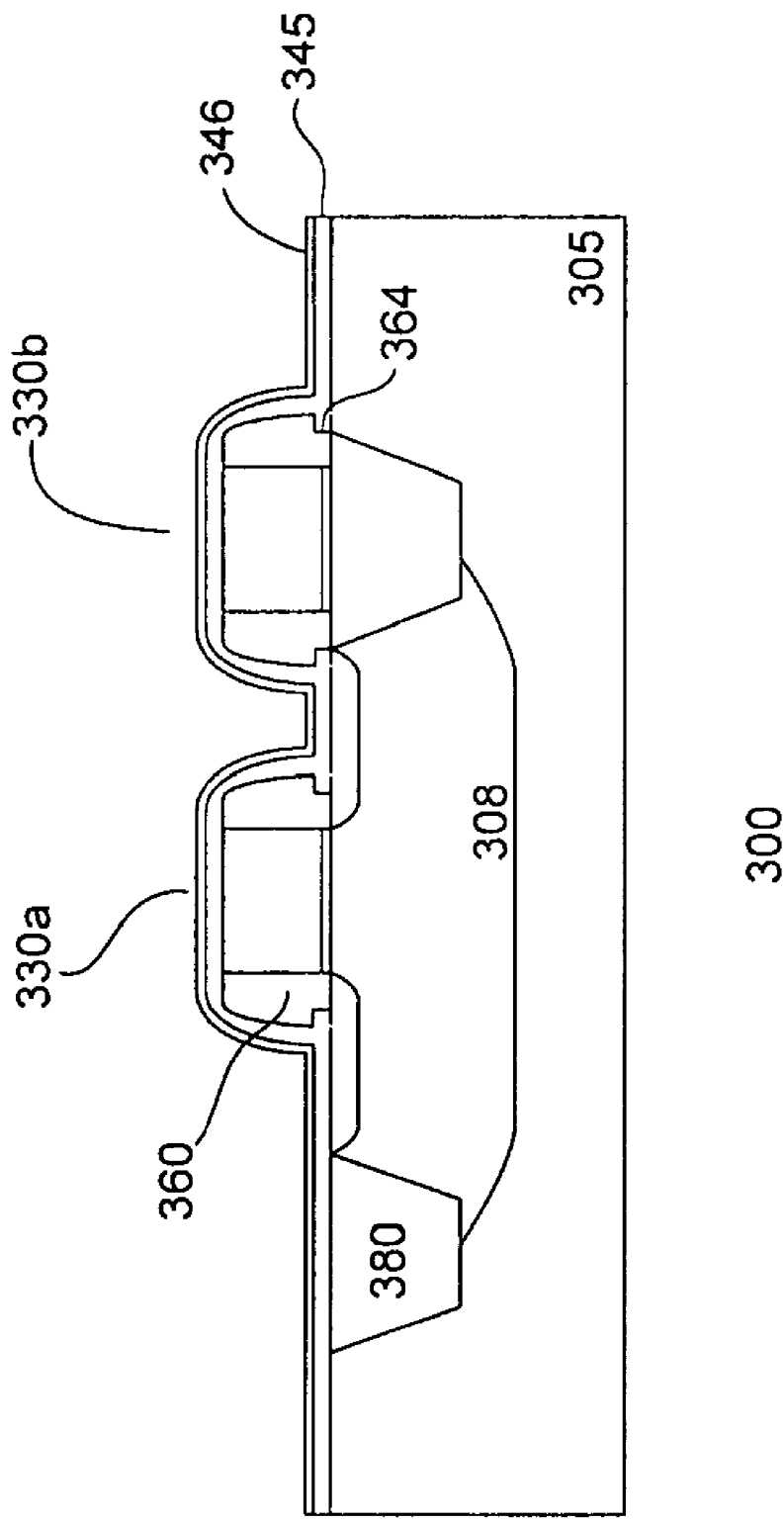

As shown in FIG. 3f, a metal layer 345 is deposited over the substrate, covering the diffusion regions and gate. Preferably, the metal layer comprises nickel, platinum, gold or a nickel alloy, such as nickel platinum. Other metals are also useful. Typical thickness of the metal layer is about 10-1000 Å. Other thicknesses are also useful. A cap layer 346 is deposited over the metal layer. The cap layer prevents oxidation of the metal layer. The cap layer comprises, for example, titanium nitride (TiN). Conventional deposition techniques, such as sputtering, are used to form the metal and cap layers.

Figure 3G:
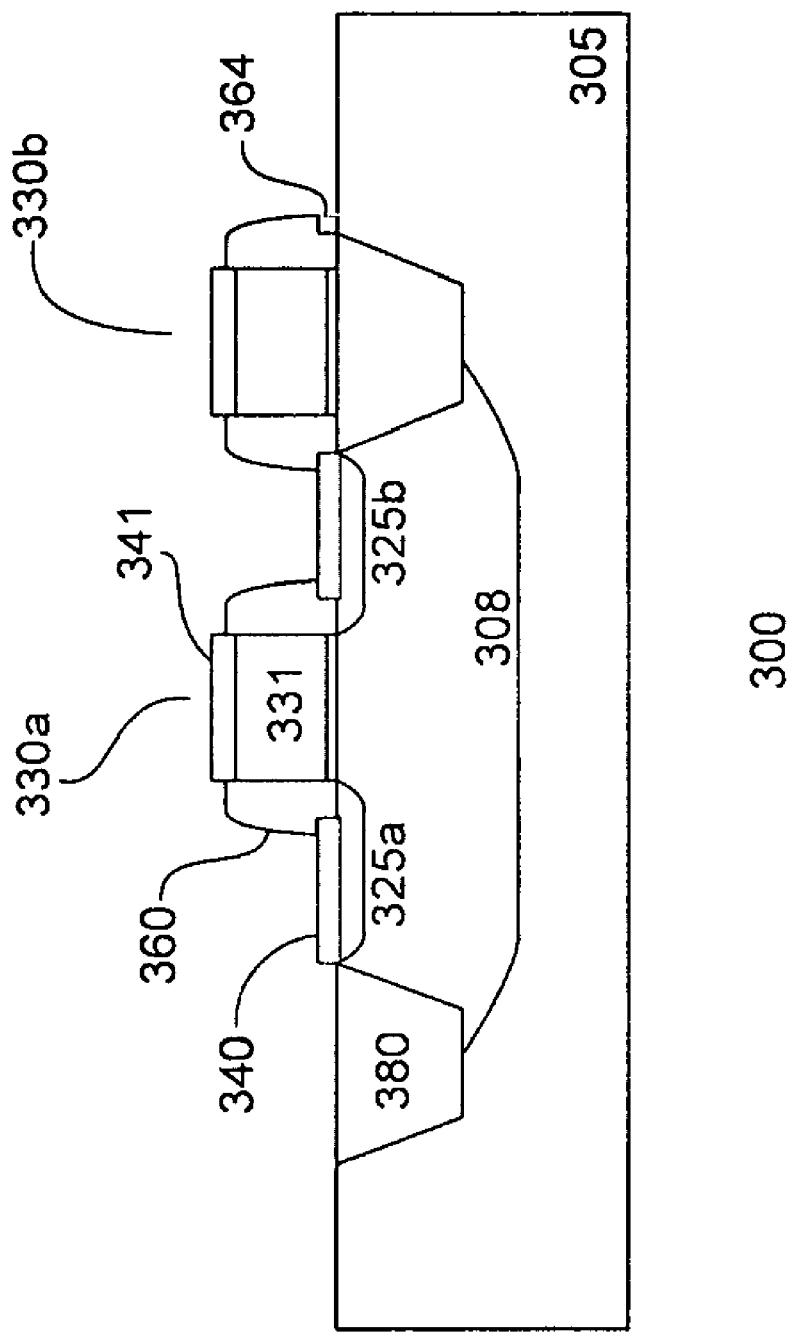

Referring to FIG. 3g, a salicide process is performed to form metal silicide contacts 340 and 341 over the diffusion regions and the gate electrode. In one embodiment, the salicide process forms nickel or nickel alloy silicide contacts. The salicide process, for example, comprises annealing the substrate, causing a reaction between the metal and silicon (e.g., substrate, epi and polysilicon). Typically, the salicide process comprises rapid thermal annealing (RTA). In one embodiment, annealing is conducted in one step at a temperature of about 300-400° C. for about 1-1000 sec. Unreacted metal and cap material are then removed, for example, by wet cleaning using a sulfuric peroxide mixture (SPM) or an ammonium peroxide mixture (APM). As shown, a portion of the spacers overlays the metal silicide contacts due to the presence of the undercuts in the bottom of the spacers.

Figure 3H:
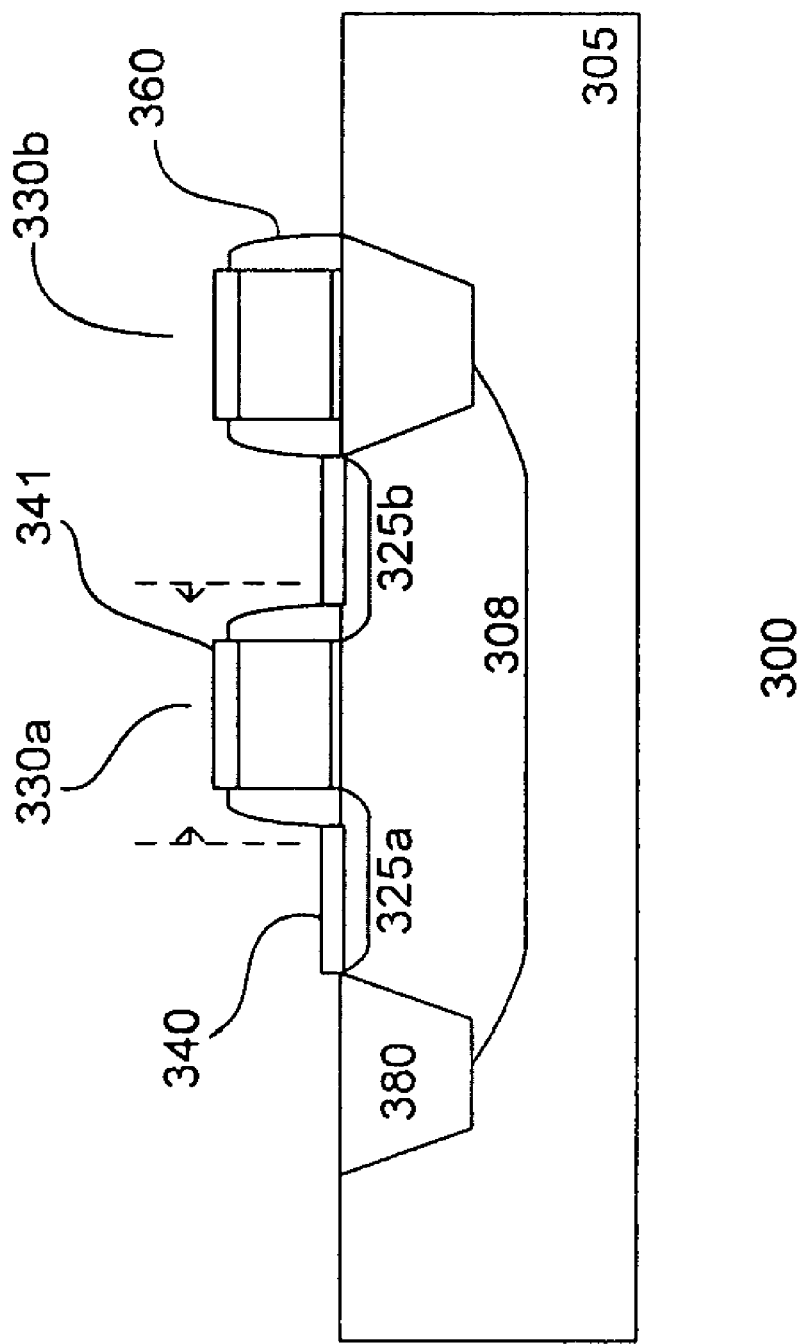

Referring to FIG. 3h, the outer walls of the spacers are reduced or pulled back. In one embodiment, the spacers are pulled back to be in alignment with the silicide contacts, as indicated by dotted lines and arrows. Pulling back the spacer outer walls avoids any spacer material overlaying the silicide contacts. In one embodiment, pulling back of the outer walls of the spacers is achieved with an anisotropic etch, such as RIE or dry etch. Preferably, the spacer pull-back etch is highly selective to the silicide contacts and STI. In one embodiment, the spacer pull-back etch employs a $CH_2F_2/Ar/O_2$ or $CHF_3/Ar/O_2$ chemistry, and is performed at a temperature of about 1-150° C. and a pressure of about 5-45 mTorr. Under such conditions, SiN-to-Si or SiN-to-oxide etch selectivity of more than about 10:1 can be obtained. Other etch chemistries or techniques of pulling back the spacers are also useful. Pulling back the spacers also advantageously removes residues at the STI corners. An additional dry and/or wet clean may be performed to remove etch residues.

In one embodiment, a second annealing step is performed after the spacer pull-back etch in order to lower the resistance of the silicide contacts. For example, nickel-rich nickel disilicide ($NiSi_2$) formed after the anneal prior to spacer pull back is converted to the lower resistivity nickel monosilicide (NiSi) phase in this step. In one embodiment, the second annealing step is conducted at a temperature of about 400-600° C. for about 1-1000 sec.

As described, the formation of the silicide contacts comprises, in one embodiment, first and second RTA processes. The use of more than one RTA step facilitates the formation of the desired silicide phase to achieve lower contact resistance. For example, a first annealing step is conducted at a lower temperature to form nickel-rich silicide, followed by a second annealing step at a higher temperature to form nickel monosilicide which has lower resistivity. In one embodiment, as described, the spacer pull back etch is performed in-between the two RTA processes. This avoids stress on the silicide contacts during the second annealing step. Alternatively, the spacer pull-back etch may be performed after the second annealing step.

The process continues by forming interconnections to the contacts of the transistors. For example, a dielectric is deposited and patterned to create vias and trenches. The vias and trenches are then filled with conductive material, such as copper, to form interconnects. Additional processes are performed to complete the IC, for example, additional interconnect levels, final passivation, dicing, and packaging.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a transistor in an integrated circuit (IC) comprising:
   providing a substrate having a gate on the substrate, the gate having gate sidewalls, and diffusion regions in the substrate adjacent to the gate;
   forming dielectric spacers on the gate sidewalls;
   forming metal silicide contacts over the diffusion regions, wherein portions of the metal silicide contacts are covered by the spacers; and
   pulling back the dielectric spacers to reduce stress on the metal silicide contacts.

2. The method of claim 1 wherein the dielectric spacers are pulled back such that outer walls of the dielectric spacers are aligned with edges of the metal silicide contacts.

3. The method of claim 1 wherein pulling back the dielectric spacers comprises an anisotropic etch.

4. The method of claim 1 comprising:
   cleaning the substrate surface after forming the dielectric spacers, wherein the cleaning forms undercut regions in a lower portion of the dielectric spacers such that edge portions of the metal silicide contacts in the undercut regions are covered by the spacers.

5. The method of claim 4 wherein pulling back the dielectric spacers is performed after formation of the metal silicide contacts to align outer walls of the dielectric spacers with edges of the metal silicide contacts.

6. The method of claim 4 wherein cleaning the substrate surface comprises wet cleaning using DHF in a dilute aqueous solution.

7. The method of claim 1 wherein forming the metal silicide contacts comprises performing first and second annealing processes.

8. The method of claim 7 wherein the first annealing process is conducted at a first temperature range and the second annealing process is conducted at a second temperature range that is higher than the first temperature range.

9. The method of claim 8 wherein pulling back the dielectric spacers is performed between the first and second annealing processes.

10. The method of claim 8 wherein pulling back the dielectric spacers is performed after the second annealing process.

11. The method of claim 1 wherein the metal silicide contacts comprise nickel or nickel alloy.

12. A method for reducing metal pipes comprising:
    providing a feature on a substrate;
    forming dielectric spacers on sidewalls of the feature;
    forming metal silicide contacts on the substrate adjacent to the dielectric spacers, wherein portions of the metal silicide contacts are covered by the spacers; and
    pulling back the dielectric spacers to reduce stress on the metal silicide contacts.

13. The method of claim 12 wherein the dielectric spacers are pulled back such that outer walls of the dielectric spacers are aligned with edges of the metal silicide contacts.

14. The method of claim 12 wherein pulling back the dielectric spacers comprises an anisotropic etch.

15. The method of claim 12 comprising:
    cleaning the substrate surface after forming the dielectric spacers, wherein the cleaning forms undercut regions in a lower portion of the dielectric spacers such that edge portions of the metal silicide contacts in the undercut regions are covered by the spacers.

16. The method of claim 15 wherein pulling back the dielectric spacers is performed after formation of the metal silicide contacts to align outer walls of the dielectric spacers with edges of the metal silicide contacts.

17. The method of claim 15 wherein cleaning the substrate surface comprises wet cleaning using DHF in a dilute aqueous solution.

18. The method of claim 12 wherein forming the metal silicide contacts comprises performing first and second annealing processes.

19. The method of claim 18 wherein the first annealing process is conducted at a first temperature range and the second annealing process is conducted at a second temperature range that is higher than the first temperature range.

20. The method of claim 18 wherein pulling back the dielectric spacers is performed in between the first and second annealing processes.

* * * * *